United States Patent [19]
Cooke

[11] Patent Number: 4,482,810
[45] Date of Patent: Nov. 13, 1984

[54] ELECTRON BEAM EXPOSURE SYSTEM

[75] Inventor: Larry Cooke, Cupertino, Calif.

[73] Assignee: Storage Technology Partners, Louisville, Colo.

[21] Appl. No.: 431,869

[22] Filed: Sep. 30, 1982

[51] Int. Cl.³ ............................................ H01J 37/302
[52] U.S. Cl. ................................ 250/492.2; 364/490; 364/491; 364/520
[58] Field of Search ...................... 250/492.2; 364/490, 364/491, 520

[56] References Cited

U.S. PATENT DOCUMENTS

| | | | |
|---|---|---|---|
| 4,181,860 | 1/1980 | Sumi | 250/492.2 |
| 4,387,433 | 6/1983 | Cardenia et al. | 250/492.2 X |
| 4,433,384 | 2/1984 | Berrian et al. | 250/492.2 X |

Primary Examiner—Alfred E. Smith
Assistant Examiner—Jack I. Berman
Attorney, Agent, or Firm—Bryant R. Gold

[57] ABSTRACT

A method and apparatus for reducing the number of areas multiply exposed when a workpiece is scanned by an electron beam or other exposing radiation. The areas to be exposed are described as a plurality of rectangular shapes. The method of the invention sorts the data describing the rectangles. Rectangles which overlap or abut in one direction and are coextensive in another are merged such that a smaller number of rectangles is formed. This smaller number describes an area substantially equivalent to the original pattern. The smaller number of rectangles resulting from the merging method will have a minimum of disadvantageously overlapping or abutting rectangles.

17 Claims, 27 Drawing Figures

| RECT | X | Y | LX | LY |
|------|---|---|----|----|
| 101  | 0 | 0 | 1  | 3  |
| 102  | 0 | 2 | 1  | 3  |
| 103  | 0 | 9 | 1  | 3  |
| 104  | 0 | 4 | 2  | 3  |
| 105  | 0 | 6 | 2  | 2  |
| 106  | 2 | 9 | 3  | 2  |
| 107  | 4 | 9 | 3  | 2  |
| 108  | 5 | 4 | 3  | 1  |
| 109  | 7 | 4 | 4  | 1  |

| RECT | X | Y | LX | LY |
|------|---|---|----|----|
| 111  | 0 | 0 | 1  | 5  |
| 103  | 0 | 9 | 1  | 3  |
| 114  | 0 | 4 | 2  | 4  |
| 106  | 2 | 9 | 3  | 2  |
| 107  | 4 | 9 | 3  | 2  |
| 108  | 5 | 4 | 3  | 1  |
| 109  | 7 | 4 | 4  | 1  |

| RECT | X | Y | LX | LY |
|------|---|---|----|----|
| 111  | 0 | 0 | 1  | 5  |
| 108  | 5 | 4 | 3  | 1  |
| 109  | 7 | 4 | 4  | 1  |
| 114  | 0 | 4 | 2  | 4  |
| 106  | 2 | 9 | 3  | 2  |
| 107  | 4 | 9 | 3  | 2  |
| 103  | 0 | 9 | 1  | 3  |

*FIG 7B*

| RECT | X | Y | LX | LY |
|------|---|---|----|----|
| 111  | 0 | 0 | 1  | 5  |
| 121  | 5 | 4 | 6  | 1  |
| 114  | 0 | 4 | 2  | 4  |
| 123  | 2 | 9 | 5  | 2  |
| 103  | 0 | 9 | 1  | 3  |

ELECTRON BEAM EXPOSURE SYSTEM

BACKGROUND OF THE INVENTION

This invention relates to the design and fabrication of large scale integration (LSI) and very large scale integration (VLSI) circuit chips, and more particularly to the exposure of the circuit patterns of the chip with an automated high-speed electron beam exposure system as a step in chip fabrication. Even more particularly, the invention relates to a process whereby overlapping circuit patterns are merged automatically into one pattern, thus avoiding double exposures by the electron beam system.

When an integrated circuit chip is fabricated, it is one of many chips on a thin wafer of semiconductor material. Prior to each step in the fabrication process, the wafer is coated with a thin layer of an energy-sensitive material called "resist." The resist is then exposed, by one of a variety of techniques, with the circuit pattern corresponding to the next step of the fabrication process. The resist is then developed, uncovering those areas of the wafer that are to be subjected to the next step of the process and protecting those ares that are not to be affected. When all the steps of the fabrication process are completed, the wafer is scribed along the unused channels between the chips and the individual chips are broken off from the wafer.

As the integrated/technology evolved to what is now called LSI and VLSI, the dimensions of the individual circuits on a chip decreased, and the density, or number of circuits per unit area, increased. This requires that the circuit patterns used for each step be made more precisely for accurate alignment. The high resolution of an electron beam system makes it a good tool for exposing the circuit pattern and is commonly used in LSI and VLSI technology.

When an electron beam system is used to expose the circuit pattern, there are two basic ways in which the exposure can be made: (1) exposure of the circuit pattern directly on the resist coated wafer; and (2) creation of a mask by exposing the circuit pattern on a resist coated glass plate. When the mask method is used, the pattern on the mask is then transferred, by a variety of methods, to the resist coated wafer. Since the actual method of exposing the circuit pattern on the wafer is immaterial to the present invention, the discussion of the invention will assume the mask method is used.

The number of circuits involved in LSI and VLSI technology, coupled with the task of interconnecting this large number of circuits, virtually requires that a computer be used as a tool in LSI and VLSI design. Typically, special purpose programs are written to handle the large amount of data necessary to describe the design.

Each process step in the fabrication of a chip requires a different mask. For convenience, the masks are assigned consecutive layer numbers. The data describing the chip design is also divided into layers, processed by the programs, and output to an electron beam system to generate the masks.

Even though each company involved in the manufacture of LSI and VLSI chips usually develops programs to meet their particular needs, a very general description of the programs used can be made. In general, a chip design consists of a number of circuit designs that are interconnected to perform the desired function. The types of circuit designs used are those that will perform the logic function of the chip, circuits for receiving signals from sources external to the chip, circuits for sending signals to loads external to the chip, special circuits used to test the chip, etc.

The electron beam exposure system is a rectilinear system, that is, the electron beam itself and the stage that moves the glass plate under the electron beam both move in an XY coordinate system. Thus each layer consists of a pattern of rectangular shapes. Even a line may be described as a rectangle with a length and a finite width.

The first step in the design of a chip is to define the design of the circuits to the program. This description consists of the location of the rectangular shapes required. The description describes the basic elements of the circuit, i.e., transistors, diodes, resistors, etc. An attempt is usually made to keep the number of circuit types to a minimum. This reduces the amount of data that the programs must handle and helps control the electrical parameters of the chip. The ideal chip design would theoretically have one very general purpose circuit which could be interconnected in a large number of ways to perform all the functions desired.

The programs used give the designer the capability to place the circuits within the area of the chip, usually in some predetermined grid. The programs keep track of the locations of the rectangles that describe the design, grouped according to the layers on which they will be exposed. Once all the circuits are placed, additional programs assist the designer in interconnecting the circuits to form logic cells and in interconnecting the cells to cause the chip to perform the desired logic function.

When the overall design is complete, the programs process the data to put it in the format required to control the electron beam system. When a mask is made, the processed data (describing the rectangles that make up the circuit pattern of the layers) is output by the program to the electron beam system.

The electron beam is deflected over the area of a rectangle to expose it. As the beam is deflected, electrons scatter from the surface and some strike adjacent resist, partially exposing it. This effect, called the proximity effect, is well known and the type of resist, its thickness on the glass plate, and the rate at which the electron beam is deflected are all chosen such that the scattered electrons will not cause the adjacent resist to become totally exposed.

If two or more rectangles being exposed are overlapped or partially overlapped, the composite shape may "balloon" at the edges where the overlap occurs. This is because as each of the rectangles are exposed, the scattered electrons partially expose the resist around each rectangle. At the edges of the rectangles where they overlap, the partial exposures caused by the scattered electrons add to each other and can cause a complete exposure. The same effect will occur where two rectangles abut. The end result is that when the glass plate is developed after exposure, the shape is distorted, or ballooned, in the region of the overlap. Since the dimensions of some of the rectangles are very small, the ballooning can cause significant effects which were not anticipated in the design.

In the design of complementary metal oxide semiconductor (CMOS) circuits, it may be desirable to overlap the shapes that comprise a design. This might be done by overlapping portions of the circuits when they are placed on the chip surface by the designer to perform functions that the individual circuits alone can not perform or by overlapping portions of a circuit to insure its manufacturability. Without the present invention, to create such an overlap, the designer must define a new composite shape to the program. This adds to the complexity of the chip design by causing more circuits to be designed and more data to be handled by the program.

The present invention allows a designer to overlap circuit shapes in any manner necessary to achieve the desired function using a small set of standard circuits. When the data describing the design is processed, the present invention identifies which overlapping rectangles can be merged and determines where the overlapping region is located. It then merges the overlapping regions such that when the data is sent to the electron beam system, there will be no overlapping and no ballooning in areas where it is undesirable, leaving the area scanned substantially equivalent to that described by the original rectangles. Thus, the merging eliminates overlapping or abutting regions without modifying the pattern scanned onto the workpiece.

SUMMARY OF THE INVENTION

The main objective of the present invention is to prevent double exposures by an electron beam system that is used as a tool in the fabrication of LSI and VLSI circuit chips, thereby improving the overall quality of the fabrication process.

Another objective of the present invention is to save time in designing a pattern of circuits to be imposed on a wafer.

Another objective of the present invention is to reduce the amount of data required to describe a pattern of shapes, some of which may overlap, where those shapes are to be imposed on a wafer or other workpiece.

Still another objective of the present invention is to reduce the area required for a pattern to be imposed on a wafer or other workpiece, by allowing a designer to overlap the shapes within the pattern wherever it is beneficial.

Yet another objective of this invention is to reduce the time required to scan a pattern on a wafer or other workpiece, by reducing the number of areas multiply exposed by an exposing beam.

The invention meets these objectives by processing the circuit data, which data describes the circuit pattern to be exposed on the electron beam system, prior to sending it to the electron beam system. The circuit pattern, in turn, consists of a large number of rectangles, some of which may overlap or abut as part of the chip design.

The invention first orders the circuit data describing the rectangles. It then compares the data for each possible pair of rectangles to identify those that overlap or abut. Rectangles that overlap or abut in the Y direction and have common X coordinates are merged into a single rectangle. The data describing the single rectangle replaces the data that described the individual overlapping or abutting rectangles.

The resulting merged data is sorted again and rectangles that overlap or abut in the X direction that have common Y coordinates are merged into a single rectangle. The data describing the single rectangle replaces the data that described the individual overlapping or abutting rectangles.

After processing by the invention, the data has few, if any, overlapping or abutting rectangles that will cause a double exposure problem when used to expose a mask or wafer.

DESCRIPTION OF THE DRAWINGS

The invention will be described with reference to the accompanying drawings, wherein.

DESCRIPTION OF THE PREFERRED EMBODIMENT

The following is a description of the best presently contemplated mode of carrying out the invention. This description is made merely for the purpose of illustrating the general principles of the invention and is not to be taken in a limiting sense. The true scope of the invention should be determined with respect to the attached claims.

When designing CMOS VLSI chips, there are times when it is desirable to cause the rectangles that define the circuits to partially overlap. Examples of this overlap are given in the following paragraphs. Although the description of the prefered emobdiment is made in terms of CMOS technology, the invention is not limited to CMOS but is applicable to any system for which defining a pattern composed of overlapping shapes is desirable, and automatically merging shapes to reduce the number of multiply defined locations is beneficial.

Figure 1A:
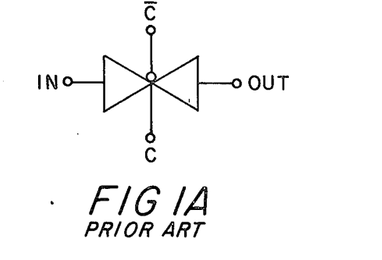
FIGS. 1A and 1B show, respectively, the logic symbol and circuit schematic of a transmission gate.
Figure 1B:
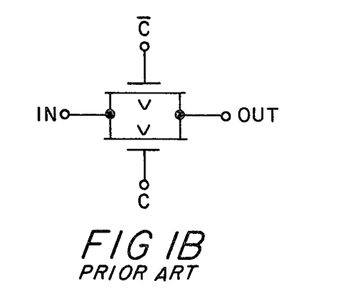

FIG. 1A shows the logic symbol used for a transmission gate. When the signal C is high, and its complement low, the transmission gate is turned on and the signal on the IN terminal will be passed through to the OUT terminal. FIG. 1B is a schematic drawing which shows how two CMOS transistors might be connected to form the transmission gate of FIG. 1A.

Figure 1C:
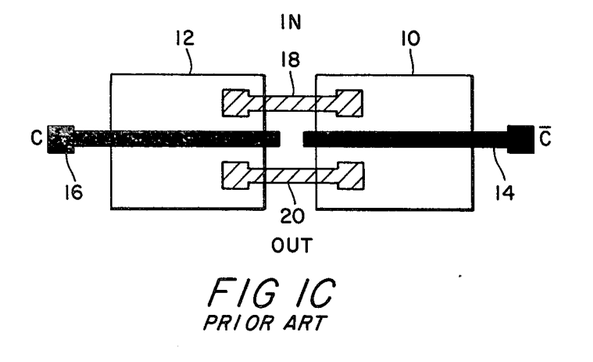
FIG. 1C shows a composite of the masks which might be used to fabricate such a transmission gate.

FIG. 1C is a composite drawing of the various masks which would be required to fabricate the transmission gate of FIG. 1A or 1B Rectangles 10 and 12 are on separate layers. These masks are used in the diffusion process steps to selectively diffuse material into the chip to form the source and drain regions of the transistors. The strips 14 and 16 are on the same layer and this mask is used in the process step to selectively allow poly-silicon to be deposited to form the gates of the transistors. Patterns 18 and 20 are likewise on the same layer, and the mask is used in the process step to selectively allow a film of metal to be deposited that interconnects the transistors, according to the interconnections specified by the schematic diagram of FIG. 1b.

Figure 2A:
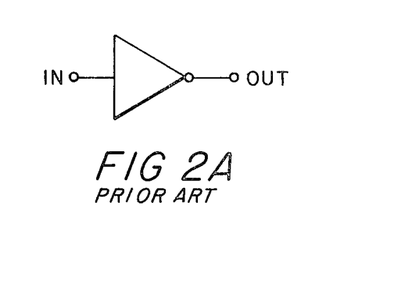
FIGS. 2A and 2B show, respectively, the logic symbol and circuit schematic of an inverter.
Figure 2B:
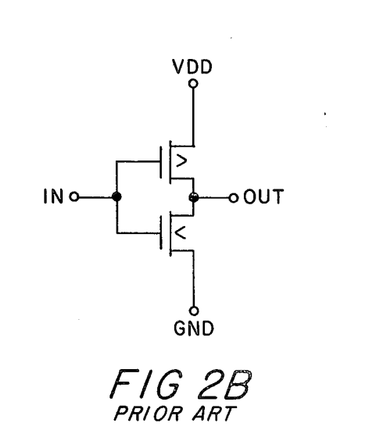

FIG. 2A shows the logic symbol used for an inverter. The signal OUT is the logical inversion of the signal IN. FIG. 2B is a schematic drawing which shows how two CMOS transistors might be connected to form an inverter.

Figure 2C:
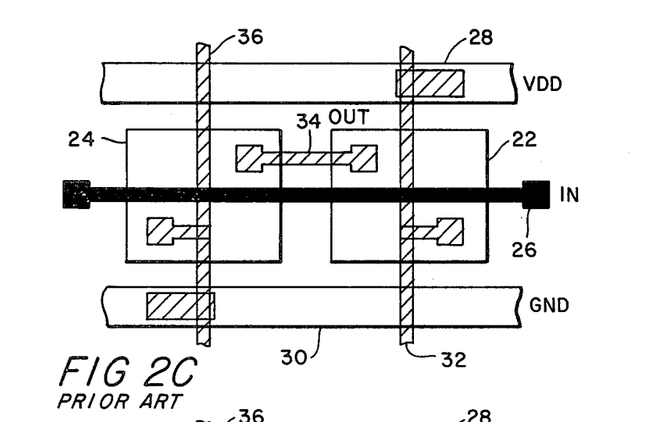
FIGS. 2C and 2D show two alternative composites of the masks which might be used to fabricate such an inverter.

FIG. 2C is a composite drawing of the various masks which would be required to fabricate the inverter. As in the case of FIG. 1C, the various rectangles shown would be on different layers, with 22 on layer 1, 24 on layer 2, 26 on layer 3, 28–30 on layer 4, and 32–36 on layer 5. The IN connection is made to the poly-gate 26 and the OUT connection would be made to the metal trace 34.

Figure 2D:
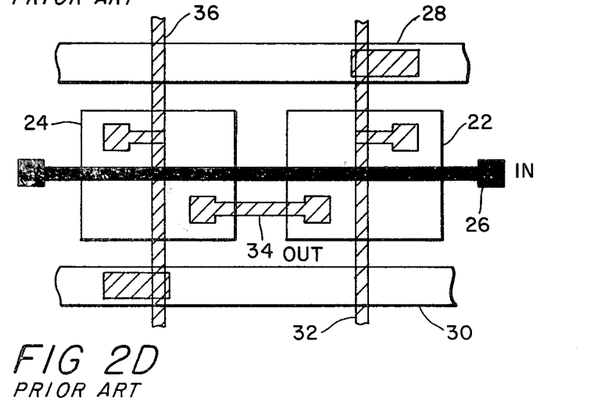

In CMOS technology, the source and drain are interchangeable. FIG. 2D illustrates this feature by showing a composite drawing of a second set of masks that could be used to fabricate the inverter. The circuits fabricated from 2C and 2D would be functionally identical.

Figure 3A:
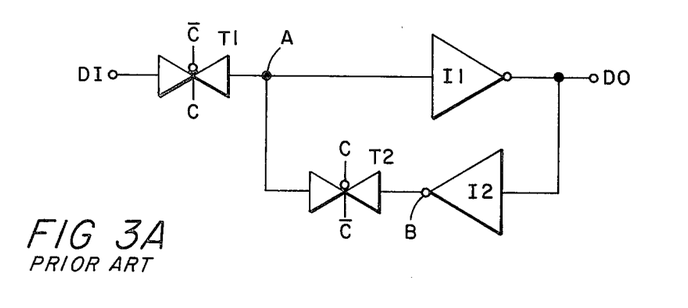
FIGS. 3A and 3B show the logic drawing and circuit schematic of a latch.

FIG. 3A is a logic drawing of a latch, which is made by connecting two transmission gates and two inverters in the manner shown. When the clock signal C is high, and its complement low, transmission gate T1 is turned on and T2 is turned off. The data in signal, DI, is applied to the input of inverter I1. After inversion, the data out signal, D0, is applied to both the output terminal D0 and the input of inverter I2, which inverts the signal to the same polarity as DI and applies it to the transmission gate T2. When the clock signal C reverses polarity, transmission gate T1 turns off while T2 turns on. The output of inverter I2, a signal with the same polarity as DI, is thus applied to the input of inverter I1, "latching" the polarity of DI in the latch.

Figure 3B:
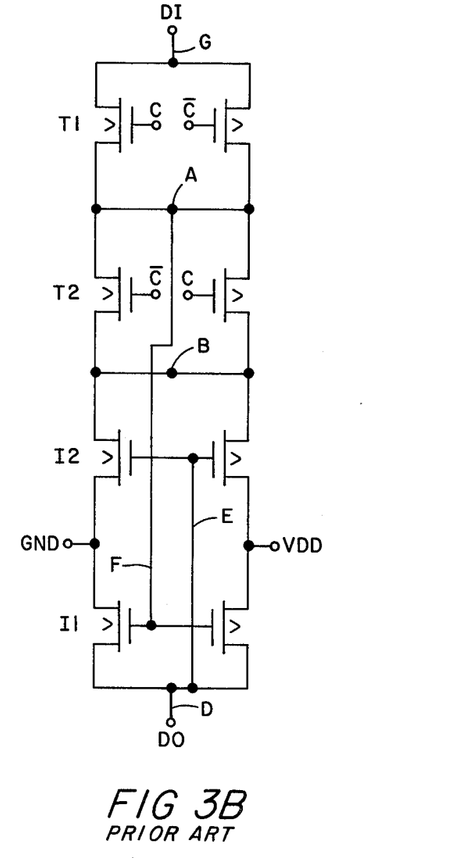

FIG. 3B is a schematic drawing showing how eight CMOS transistors might be interconnected to form the latch circuit of FIG. 3. The circuits, from FIGS. 1B and 2B, are arranged top to bottom as T1, T2, I2 and I1, in FIG. 3B.

Figure 3C:
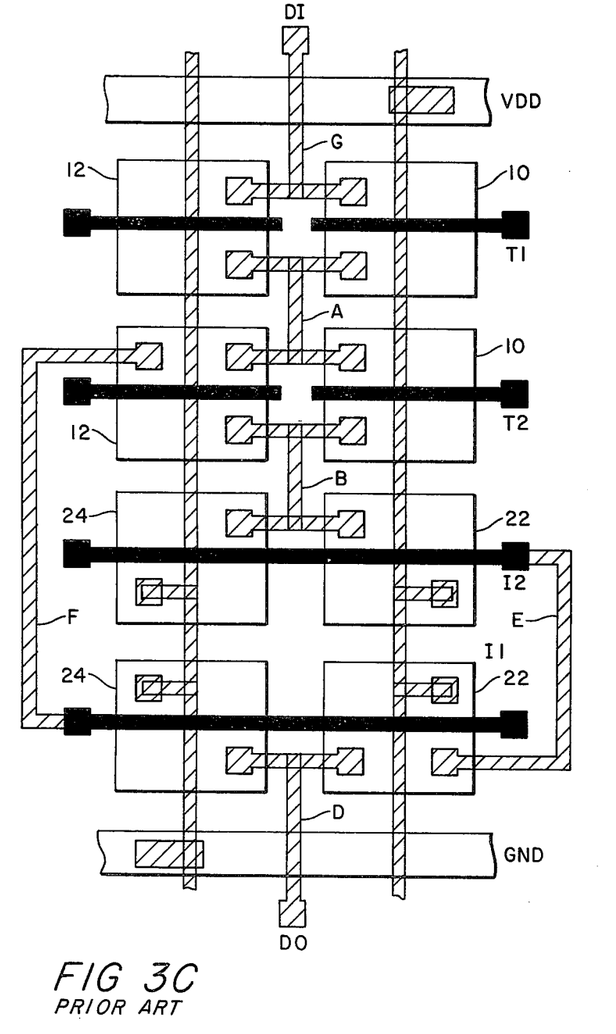
FIG. 3C shows a composite of the masks which might be used to fabricate such a latch.

FIG. 3C is a composite drawing of the masks which would be required for one possible method of fabricating the latch. The composite masks of FIG. 1C are used for T1 and T2, the composite mask of FIG. 2C is used for I2, and the composite mask of FIG. 2D is used for I1. The metal traces, A, B, D,-G, have been added to complete the desired interconnections as specified by FIG. 3B.

As stated previously, in CMOS technology, the source and drain of a transistor are interchangeable. Thus, in FIGS. 1C and 2C, the top halves of the rectangles 10–12 and 22–24 are defined to be the drain and the lower halves are defined to be the source. In FIG. 2D, the opposite is the case. Hence, in FIG. 3C, the sources of the two transistors of T1 are connected to the drains of the two transistors of T2 with trace A; the sources of the two transistors of T2 are connected to the drains of the two transistors of I2 with trace B; the source of the left hand transistor of I2 is connected to the source of the left hand transistor of I1 by the GND connection while the VDD connection does the same for the right hand transistors.

A unique characteristic of the CMOS technology is than when the source of one transistor is connected to the drain of another transistor, the connection point does not have to consist of an individual source and an individual drain. Rather, the two elements can be fabricated from a single diffusion area. With this characteristic in mind, the same latch circuit realized in FIG. 3c can be simplified to that illustrated in FIG. 4.

Figure 4:
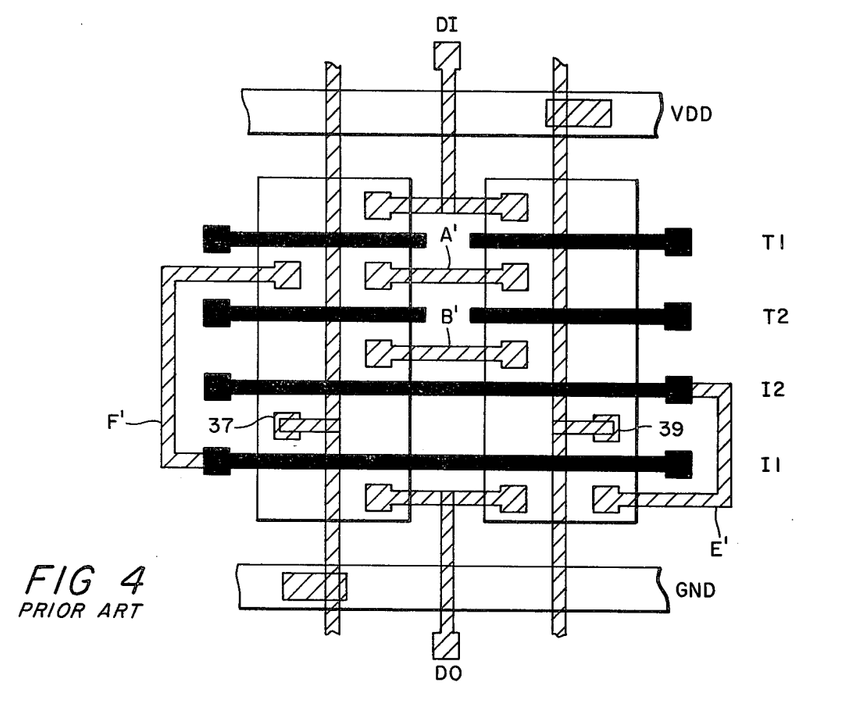
FIG. 4 is a composite of the masks which could be used to fabricate the latch of FIG. 3. and shows how the elements of the inverters and transmission gates can be overlapped to save space on the chip.

FIG. 4 is a composite drawing of the masks that would be required for a second method of fabricating the latch of FIG. 3. The sources of T1 and the drains of T2 are physically combined at A', and the sources of T2 and the drains of I2 are combined at B'. Similarly, the source-drain combinations that were connected to GND and VDD on FIG. 3C are each made at a single contact point 37 and 39 respectively in FIG. 4. The wiring traces at A and B of FIG. 3C have been eliminated in FIG. 4, and the wiring traces E and F of FIG. 3C have been shortened to E' and F' in FIG. 4.

As can be seen, if the latch is fabricated using the composite mask of FIG. 4, less area of the chip is required. FIGS. 3C and 4 are not drawn to scale, so the savings in area can not be fully appreciated from the drawings. In practice, the circuit of FIG. 4 occupies approximately twenty percent less area than that of FIG. 3C. This is a significant savings in area and, in addition to allowing more circuits to be placed on the chip, it reduces power consumption and increases the operating speed. Many other circuits, in addition to the latch shown in the example, can be fabricated using combinations of basic circuits with comparable space savings.

Without the present invention, a designer could design the latch in one of two ways. The latch shown in FIG. 3C could be designed by using the previously defined circuits of FIGS. 1C and 2C and causing them to be interconnected. Alternatively, the latch of FIG. 4 could be designed by defining the rectangles for the various layers as a separate circuit circuit design.

With the present invention, a designer can design the latch of FIG. 4 by placing the previously designed circuits of FIGS. 1C and 2C such that they overlap the correct amount and then interconnecting them in the appropriate manner. That is, the invention merges the eight overlapping rectangles, consisting of combinations of 12 and 24, and of 10 and 22, into two new rectangles 38 and 40. Doing so advantageously eliminates double exposure on the electron beam system.

Figure 5A:
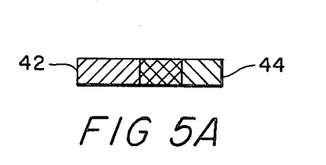
FIGS. 5A-5H show a variety of ways in which rectangles can overlap or butt against each other.
Figure 5B:
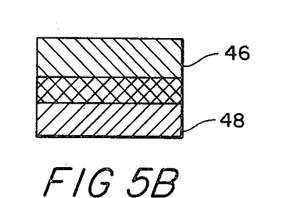

FIGS. 5A–5H show various ways in which rectangles might be overlapped. FIG. 5A, for example, shows two rectangles with equal Y dimensions, 42 and 44, partially overlapping in the X direction. FIG. 5B shows two rectangles with equal X dimensions, 46 and 48, partially overlapping in the Y direction.

Figure 5C:
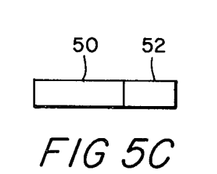
Figure 5D:
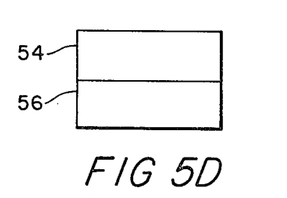

FIG. 5C shows two abutting rectangles with equal Y dimensions, 50 and 52, while FIG. 5D shows two abutting rectangles, 54 and 56, which have equal X dimensions. Even though the rectangles only abut each other with no overlap, the present invention handles such abutting and thus improving the quality of the mask.

Figure 5E:
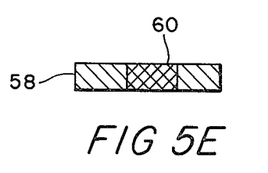
Figure 5F:
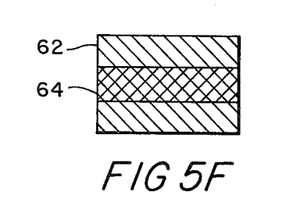
Figure 5G:
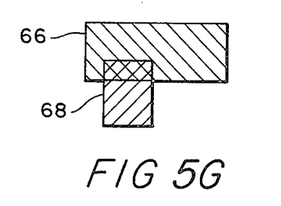
Figure 5H:
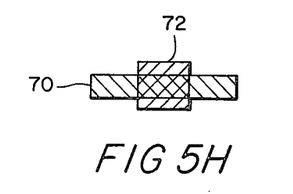

FIG. 5E shows two rectangles, 58 and 60, with equal Y dimensions where the rectangle 60 is totally overlapped by rectangle 58. FIG. 5F shows two rectangles, 62 and 64, with equal X dimensions where the rectangle 64 is totally overlapped by the rectangle 62. FIG. 5G shows an example of two rectangles, 66 and 68, which have unequal dimensions and have a partial overlap. FIG. 5H shows two rectangles 70 and 72, with unequal dimensions which overlap but where portions of each rectangle extend beyond the edges of the other.

The present invention automatically merges the pair of rectangles of each example of FIGS. 5A through 5F into a single rectangle such that when the combined pattern is exposed on the electron beam system, only one rectangle will be exposed. The invention does not merge the two rectangles shown in each of the examples of FIGS. 5G and 5H. This is advantageous, because, for example, FIG. 5H is a case where a double exposure is generally desired. The pattern shown is typical of the metalization layers used to interconnect the circuits; the rectangle 70 represents a metal trace and the rectangle 72 represents a metal pad which would electrically connect the trace to another layer. By exposing the two rectangles as shown, the right angle corners where they meet are doubly exposed and the resist near the corners is also exposed. When developed, the trace and pad merge together in a curving manner rather than a sharp right angle. This results in a trace/pad connection which can be fabricated more reliably. A similar desired result (rounded corners) is obtained with regard to FIG. 5G.

According to the present invention, a computer may be used to achieve the above stated results; thus, when a chip design is completed, the computer processes the design data for each layer and puts the processed data in an output file. This data is in the correct format to control the electron beam system. The data for each layer consists of a description of each rectangle that is to be exposed on that layer.

The operation of a typical electron beam system is described in U.S. Pat. No. 4,132,989 to Buelow, et. al., which is hereby incorporated by reference. In such a system, the area which is capable of being scanned is only a small portion of the total area of the workpiece. Therefore, the chip is broken down into smaller continuous scan fields, called partitions, which are somewhat smaller than the total area capable of being accurately scanned at one time. Each partition is scanned by the electron beam, and then the surface to be exposed is moved. Typically the workpiece is mounted on a stage which can be very accurately positioned. This stage is moved, and the partition scanned, until all of the rectangles have been exposed.

In such a system, it is advantageous to scan a rectangle in its entirety within a single partition, because a rectangle which extends across the boundary may be slightly misaligned after the stage steps to the next partition. Therefore, a program processes the data to determine if any rectangles extend beyond the partition, yet are within the boundary which may be physically scanned by the system. If such rectangles are found, it is desirable that they be exposed in a single step. For this reason, the edge of a partition is called a "soft" boundary, while the boundary to which the electron beam can accurately be deflected is called the "hard" boundary. The output of this process is such that two rectangles would be created to describe a single actual rectangle: one extending to the soft boundary, and the other beyond the soft boundary to the edge of the rectangle to be scanned. These abutting rectangles may then be advantageously processed by the current invention to create a single merged rectangle.

The method of the current invention first sorts the rectangles of a field to arrange them in particular order. Rectangles that overlap or abut are then combined, if advantageous, into a single rectangle.

The rectangles are sorted by X, LX, Y, and LY, respectively, where X and Y are the coordinates of the lower left corner of the rectangle, LX is the length of the rectangle and LY is the height of the rectangle. Those rectangles that overlap or abut and have common X coordinates are then merged. The resulting rectangles are then sorted by Y, LY, X, LX respectively. The method of the present invention then further merges those rectangles that overlap or abut and have common Y coordinates.

FIGS. 6, 7 and 8 illustrate how the present invention processes a set of nine representative rectangles. The rectangles are shown on an arbitrary grid and are cross hatched. They overlap in those areas that are double cross hatched.

Figure 6A:
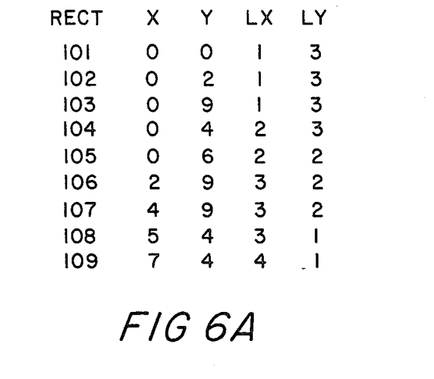
FIGS. 6A and 6B show nine representative rectangles with various overlaps and the order in which they would be sorted by the present invention.
Figure 6B:
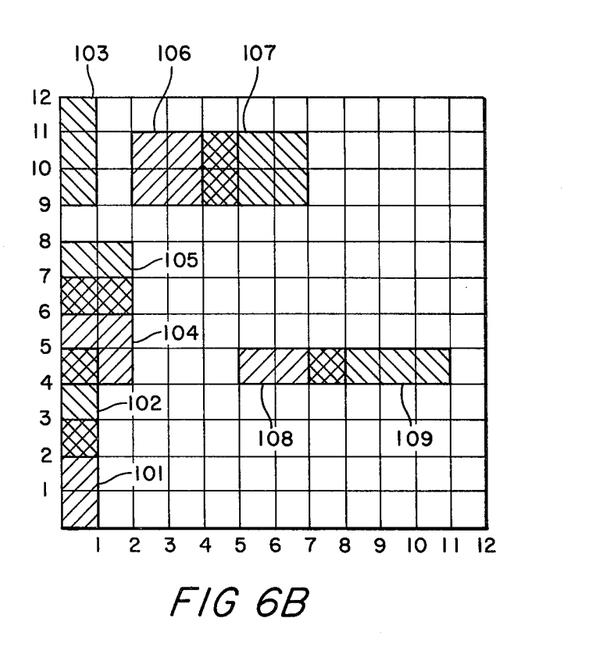

FIG. 6A tabulates the rectangles of FIG. 6B by showing the X,Y coordinate of the lower left corner and X length and Y length of each rectangle 101-109. The rectangles are arranged in the order they would be in after being sorted by X, LX, Y, and LY. The type of sort program used is not material to the invention. Any of the well known sorting routines could be used. FIG. 6B is a pictoral representation of the nine rectangles, showing five areas of overlap.

Figure 7A:
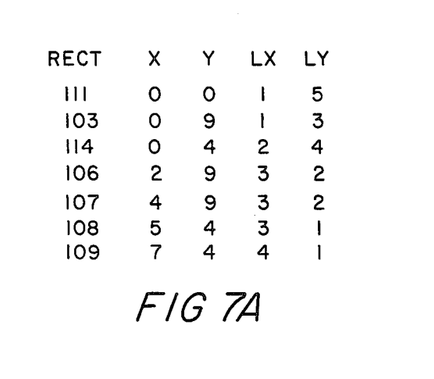
FIGS. 7A, 7B, and 7C show the seven rectangles that result from merging the nine rectangles of FIG. 6 in the Y direction, and the order in which they would be merged and then sorted by the present invention.

The method of the present invention first merges the data of the rectangles of FIG. 6A in the Y direction. That is, those rectangles which have common X coordinates and overlap or abut in the Y direction are merged into a single rectangle. FIG. 7A shows how data for the resulting rectangles would be ordered in the file after the first merge. Rectangles 101 and 102 of FIG. 6B are merged into rectangle 111 of FIG. 7C. Rectangle 103 cannot be merged. Rectangles 104 and 105 are merged into rectangle 114. The remaining rectangles of FIG. 6, 106-109 cannot be merged in the Y direction.

Figure 7B:
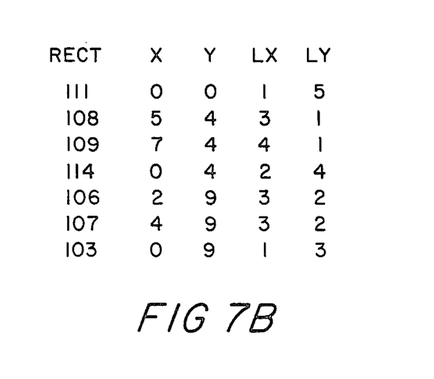
Figure 7C:
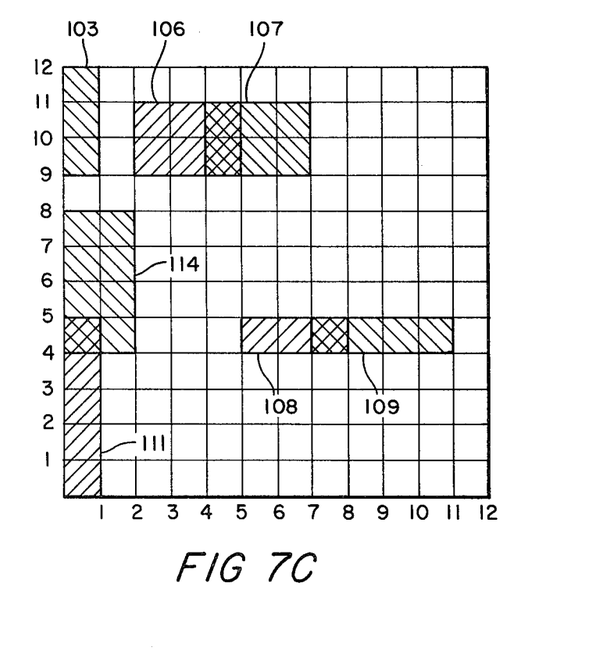

FIG. 7B shows the order that the remaining seven rectangles would be in after the second sort which sorts in the order of Y, LY, X, LX. FIG. 7C is a pictoral representation of the seven rectangles.

Figure 8A:
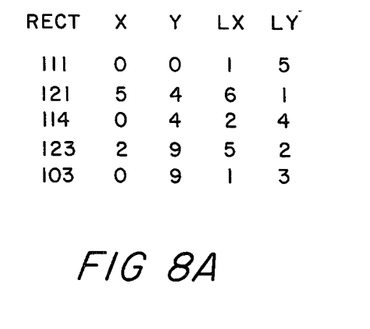
FIGS. 8A and 8B show five rectangles that result from merging the seven rectangles of FIG. 7 in the X direction, and the order in which they would be merged by the present invention.

The next step of the invention is to merge the data of the rectangles of FIG. 7B in the X direction. That is, those rectangles that have common Y coordinates and overlap or abut in the X direction are merged into a single rectangle. FIG. 8A shows how the data for the resulting five rectangles would be ordered in the file after the second merge.

Figure 8B:
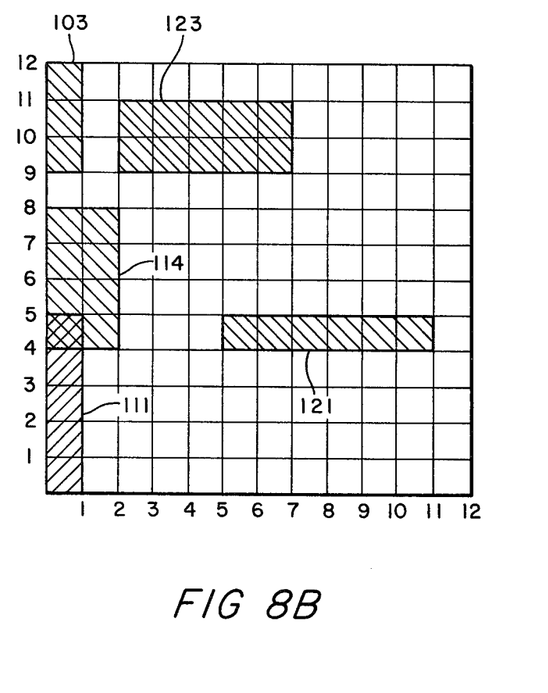

Rectangle 111 can not be merged. Rectangles 108 and 109 are merged into the single rectangle 121. Rectangle 114 can not be merged. Rectangles 106 and 107 are merged into the single rectangle 123. Rectangle 103 can not be merged. FIG. 8B is a pictoral representation of the five rectangles that result from the second merge.

Thus, in the simple example shown, the invention merges eight rectangles into four rectangles. Four areas of double exposure were eliminated in the process, improving the quality of the mask which would result from exposure on the electron beam system.

Figure 9:
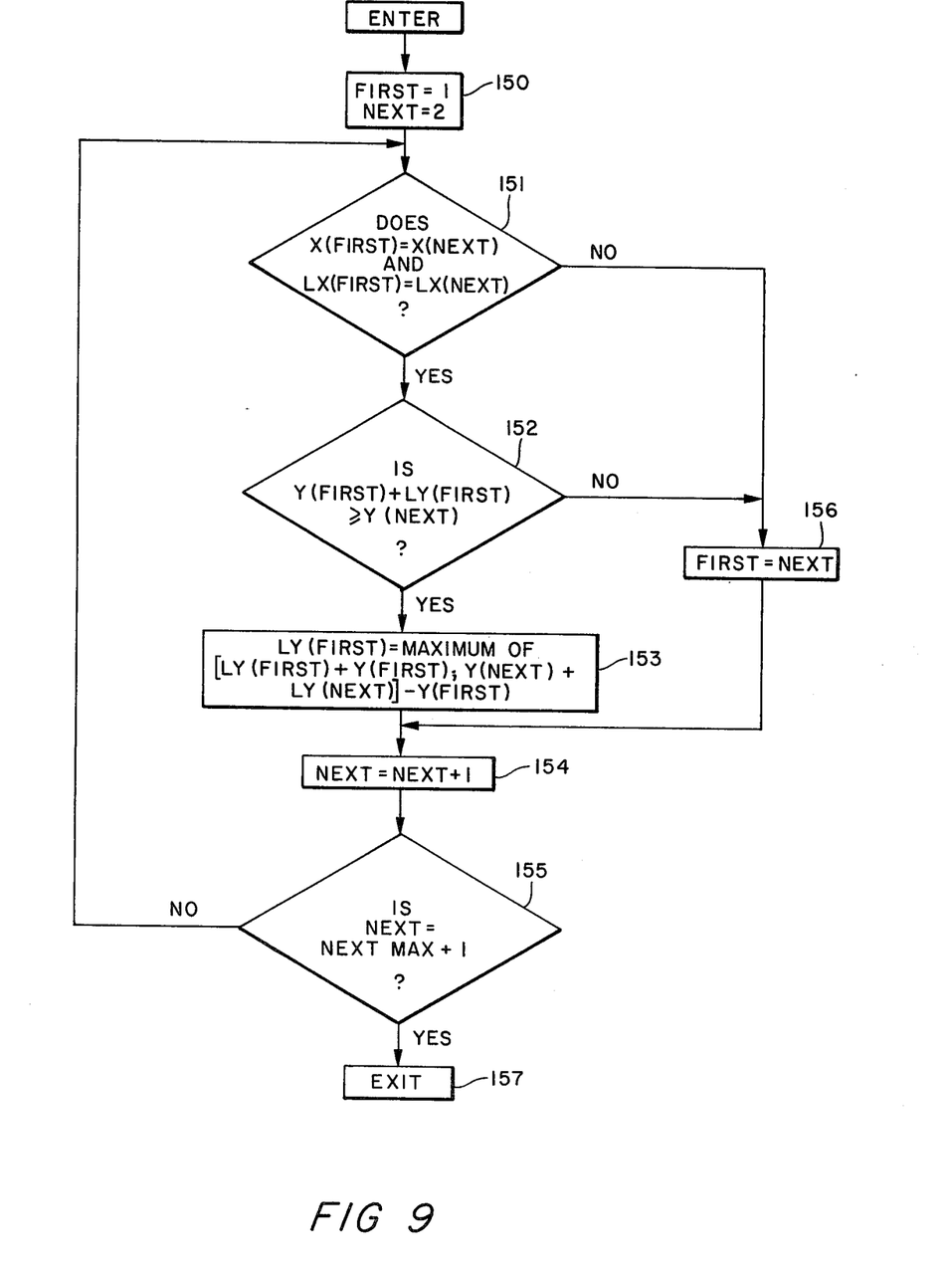
FIG. 9 is a flow chart illustrating the method used by the present invention to merge in the Y direction.

FIG. 9 is a flow chart illustrating the process used by the invention to merge rectangles in the Y direction. A similar process is used for the merge in the X direction and the flow chart can be made applicable by interchanging X and Y.

The invention starts by initializing FIRST to 1 and NEXT to 2 as shown in block 150. FIRST is now pointing to the data of the first rectangle of FIG. 6a and NEXT is pointing to the data of the second rectangle.

In block 151, a check is made to see if the two selected rectangles have common X coordinates. If so, a check is made in block 152 to determine if the rectangles either overlap or abut. If so, the two rectangles are merged in block 153. If neither condition is true, FIRST is made equal to NEXT in block 156, NEXT is incremented in block 154 and the next two rectangles from the table of FIG. 6a are compared.

The rectangles are merged by block 153 by finding the new value of LY for the merged rectangles. This is done by using the maximum of one of two possible values. If LY(FIRST)+Y(FIRST) yields the maximum value, rectangle NEXT is totally overlapped by rectangle FIRST. IF Y(NEXT)+LY(NEXT) yields the maximum value, the two rectangles either partially overlap or abut. After merging, the data for the new rectangle, X, Y, LX, LY, is placed in the file of FIG. 7a. If no merge is performed, the rectangle data being pointed to by FIRST is sorted in the next location of FIG. 7a before FIRST is changed to NEXT by block 156.

After the merge, NEXT is incremented by block 154. Note that FIRST is not changed after a merge. This is because the next rectangle, pointed to by the new value of NEXT, may merge with the rectangle pointed to by FIRST. That is, the invention can merge any number of overlapping and/or abutting rectangles, as long as they meet the criteria for merging.

Block 155 checks to see if all the rectangles in the file have been checked for merging. If not, the check is performed again with a new value of NEXT and possibly a new value of FIRST. If they have all been checked, the test will be positive and the file of FIG. 7A is complete.

TABLE 1 is a representative program listing showing one possible implementation of the invention. This program will accomplish a merge in the Y direction. The program for the merge in the X direction would be identical with X replacing Y and Y replacing X. The statements of a program will vary, dependent upon the program language in which it is written, individual style, and the particular use of the invention.

As will be evident from the foregoing description, certain aspects of the invention are not limited to the specific details of the examples cited, and it is therefore contemplated that other modifications or applications will be apparent to those skilled in the art. It is accordingly intended that the appended claims shall cover all such modifications and applications, as do not depart from the spirit and scope of the invention.

TABLE 1

Representative Program Listing For Merging In The Y Direction

```
FIRST = 1
NEXT = 2
DO (NEXT MAX+1) TIMES
   IF [X(FIRST)=(NEXT)] AND [LX (FIRST) =
   LX (NEXT)] THEN
      IF Y(FIRST) + LY(FIRST)_Y(NEXT) THEN
         LY(FIRST) = MAX[LY(FIRST)+Y(FIRST), Y(NEXT)
         +LY(NEXT)] - Y(FIRST)
      ELSE
         FIRST = NEXT
      END IF
   ELSE
      FIRST = NEXT
   END IF
   NEXT = NEXT + 1
END DO
```

I claim:

1. A method of defining a first pattern comprised of a plurality of shapes, arranged in a coordinate system having a plurality of defining coordinates, a plurality of which shapes overlap, or abut, comprising the steps of:
   (a) representing each of said shapes with at least one digital word, said word comprising a plurality of bits that define the size and location of said shapes of said first pattern in said coordinate system;
   (b) determining where a plurality of said shapes overlap or abut by electronically comparing the bits of said words; and
   (c) reducing the number of said overlapping or abutting shapes by electronically processing said digital words to merge said overlapping or abutting shapes into a smaller number.

2. The method of claim 1 wherein said smaller number of shapes define a second pattern substantially equivalent to the area described by said first pattern, said second pattern comprising a reduced number of overlapping or abutting shapes.

3. The method of claim 1, wherein said shapes are rectangular shapes, and said coordinate system is a rectilinear system.

4. The method of claim 3 further including the step of: ordering said rectangular shapes according to one of said defining coordinates.

5. The method of claims 3 or 4 further comprising the step of repeating steps (B) and (C) for each coordinate, and merging said shapes found to overlap such that each pair of said shapes is merged to form a single shape.

6. The method of claim 4 wherein said shapes are described with the bits of said digital words by the location of each shape in the coordinate system, and the extension of each shape in each coordinate.

7. A method of eliminating disadvantageously abutting or overlapping shapes defining a pattern to be processed, said shapes being arranged in a coordinate system having a plurality of defining coordinates, and said shapes being represented by a digital word that defines the coordinates of each of said shapes within said coordinate system, said method comprising the steps of:
   (a) locating each shape within the pattern by processing said digital words with electronic digital processing apparatus,
   (b) identifying overlapping or abutting shapes by using said processing apparatus to compare the coordinates of each of said shapes; and
   (c) using the processing apparatus for selectively merging said overlapping or abutting shapes into a smaller plurality of shapes by defining new coordinates for each of the merged shapes such that each merged shape is represented by a digital word that defines a single shape; thereby reducing the number of such shapes which overlap or abut.

8. The method of claim 7 wherein said shapes are rectangular shapes and said coordinate system is a rectilinear coordinate system.

9. A method of defining a pattern to be exposed on a workpiece such that the time required to expose the pattern is reduced and the distortion of the pattern is minimized, wherein said pattern comprises a plurality of shapes arranged in a coordinate system having a plurality of defining coordinates, a plurality of which shapes overlap or abut, said method comprising the steps of:
   (a) representing each of said shapes with a plurality of digital bits that define the size and location of said shapes within said coordinate system;

(b) determining those shapes that disadvantageously overlap or abut by electronically comparing said digital bits; and (c) eliminating said disadvantageously overlapping or abutting shapes by electronically processing said digital bits such that each pair of said overlapping or abutting shapes as defined by said bits is merged into a single shape, said single shape encompassing a substantially equivalent area as said pair of overlapping or abutting shapes, whereby an overlapping region, having been redefined as a single shape, may be scanned a single time, thereby reducing distortions caused by multiply scanning such regions.

10. The method of claim 9 wherein said shapes are rectangles and said coordinate system is a rectilinear system.

11. The method of claim 10 wherein step (b) includes the step of ordering said shapes according to one of said defining coordinates.

12. In a system for defining a pattern to be scanned by an exposing beam onto a workpiece, wherein said workpiece comprises a surface sensitive to said beam such that the beam produces a pattern to be used in further processing of said workpiece, and wherein said pattern comprises a plurality of shapes arranged in a coordinate system having a plurality of defining coordinates, a plurality of which shapes overlap, a method for eliminating undesirable multiple exposures defined by said overlapping or abutting shapes, thereby saving time and reducing distortions, said method comprising the steps of:

(a) defining each of said shapes with a digital word having a plurality of bits that identify the size and location of said shapes within said coordinate system;

(b) identifying a plurality of disadvantageously overlapping or abutting shapes by electronically comparing the bits of the digital word associated with each shape; and (c) electronically merging the shapes identified in step (b) by processing said digital words such that a plurality of new shapes are defined, thereby reducing distortions associated with said overlapping shapes.

13. The method of claim 12 wherein said new shapes together define a pattern substantially equivalent to the pattern previously defined and wherein said pattern comprises a minimum number of disadvantageously overlapping or abutting shapes.

14. The method of claim 12 wherein said shapes are rectangular shapes, and said coordinate system is a rectilinear system.

15. An improved method for defining a pattern comprising a plurality of shapes, wherein the pattern covers a pattern area, and wherein the method includes the steps of defining a plurality of shapes in a coordinate system to form said pattern, disregarding overlapping or abutting shapes generated by said definition, and dividing said pattern into a plurality of contiguous scan fields, each having an area smaller than said pattern, said improvement comprising the steps of:

representing each of said shapes with a digital word that identifies the size and location of said shape within said coordinate system;

digitally merging a plurality of disadvantageously overlapping or abutting regions into a smaller plurality of overlapping or abutting regions, prior to said dividing, by electronically processing said digital words, thereby reducing distortion and saving time.

16. The improvement of claim 15, wherein said shapes are rectangular shapes and said coordinate system is a rectilinear system.

17. Apparatus for defining a pattern comprising a plurality of shapes arranged in a coordinate system, said pattern to be used in processing a workpiece, said apparatus eliminating disadvantageously overlapping or abutting shapes, including:

(a) means for identifying said disadvantageously overlapping or abutting shapes, said identifying means comprising means for representing each of said shapes as a digital word that specifies the size and location of the shape within said coordinate system, and means for comparing said digital words to determine those shapes that are overlapping or abutting; and (b) means for eliminating said overlapping or abutting shapes comprising:

processing means for processing the digital words defining said overlapping or abutting shapes to create new digital words that define a single shape, the single shape having a substantially equivalent area as the overlapping or abutting shapes, said new digital words thereby defining said pattern without using overlapping or abutting shapes.

* * * * *